(12) United States Patent
Chen

(10) Patent No.: US 7,994,805 B2
(45) Date of Patent: Aug. 9, 2011

(54) ELECTROMAGNETIC INTERFERENCE TESTING DEVICE

(75) Inventor: Chien-Yi Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 370 days.

(21) Appl. No.: 12/417,638

(22) Filed: Apr. 3, 2009

(65) Prior Publication Data

US 2010/0051344 A1    Mar. 4, 2010

(30) Foreign Application Priority Data

Aug. 26, 2008    (CN) .......................... 2008 1 0304209

(51) Int. Cl.
*G01R 31/00*    (2006.01)
(52) U.S. Cl. .............. 324/750.26; 324/750.27; 361/816; 361/818
(58) Field of Classification Search .................. None
See application file for complete search history.

(56) References Cited

U.S. PATENT DOCUMENTS 6,744,268 B2 *    6/2004    Hollman ................... 324/750.14
2008/0265908 A1 *    10/2008    Hsieh et al. .................... 324/555

* cited by examiner

*Primary Examiner* — Huy Q Phan
*Assistant Examiner* — Son Le
(74) *Attorney, Agent, or Firm* — Frank R. Niranjan

(57) ABSTRACT

A testing device includes a shielding case and a driving member opening and closing the shielding case. The shielding case includes a receiving space for receiving an electronic device therein, a cover, and a base. The driving member includes a first driving member mechanically connected to an outside of the cover of the shielding case and a second driving member mechanically connected to an outside of the base of the shielding case. The first driving member moves the cover vertically relative to the base. The second driving member moves the base horizontally relative to the cover. Movement of the shielding case in an open position allows the electronic device to be received in or removed from the shielding case. Movement of the shielding case in a closed position allows the electronic device to be tested.

12 Claims, 4 Drawing Sheets

ELECTROMAGNETIC INTERFERENCE TESTING DEVICE

BACKGROUND

1. Technical Field

The present disclosure generally relates to testing devices, and more particularly to a testing device with a shielding case and a driving member.

2. Description of Related Art

With the rapid development of electronic technology, electronic devices, such as, mobile phones, wireless access points, circuit boards, and others, integrate multiple functions. The electronic devices often undergo a variety of tests to ensure quality. Frequently, the electronic device is mounted in a testing device to test whether various functions of the electronic device meet standard requirements. The testing device includes a shielding case to receive the electronic device and a driving member to open or close the shielding case for placement or removal of the electronic device. The driving member is positioned in the shielding case and electrically connected to external power via wires extending through openings of the shielding case. However, during testing, ambient electromagnetic waves can enter the shielding case through the openings and interfere with testing results.

Therefore, a need exists in the industry to overcome the described limitations.

DETAILED DESCRIPTION

Figure 1:
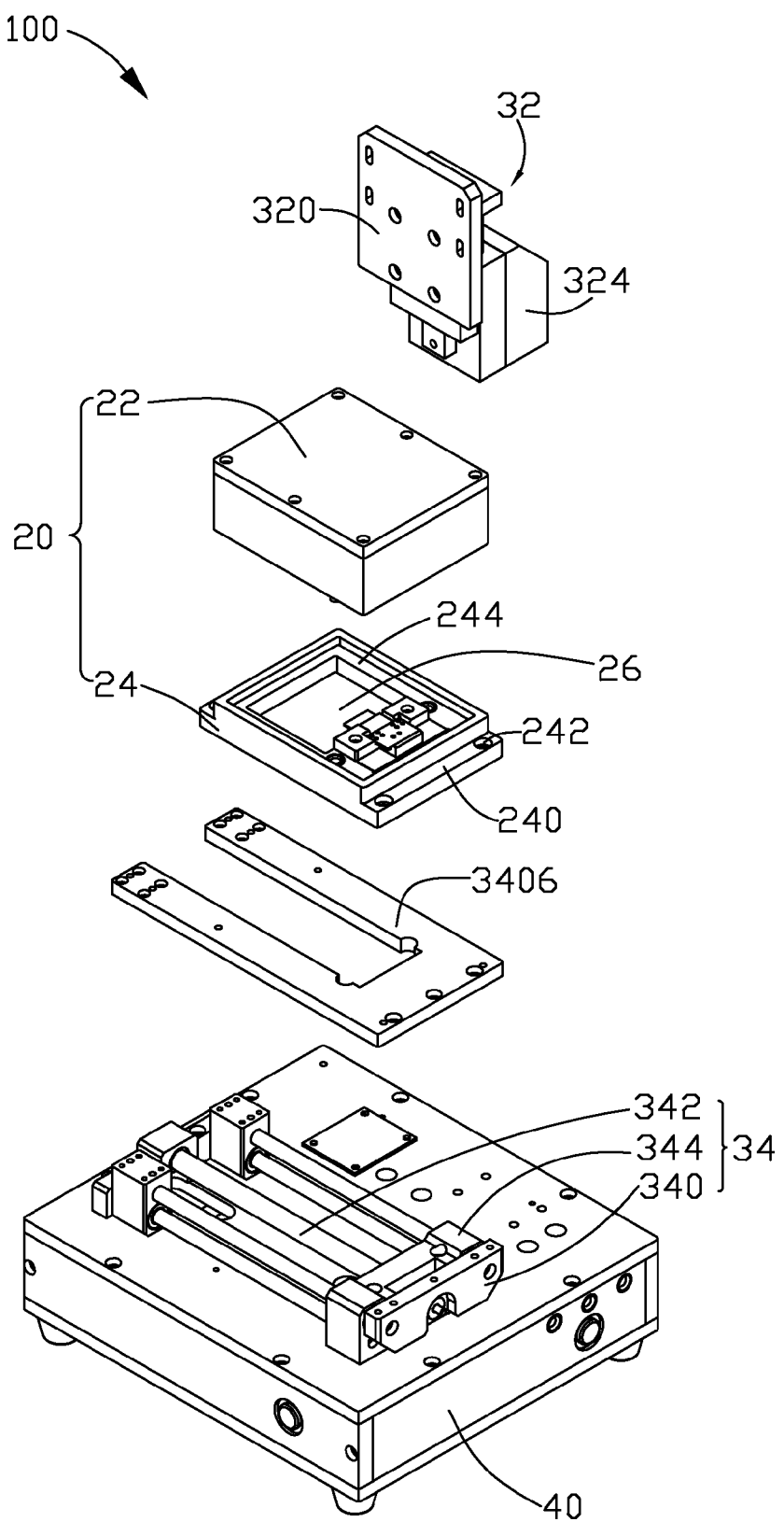
FIG. 1 is an exploded, isometric view of a testing device of an exemplary embodiment of the disclosure.
Figure 2:
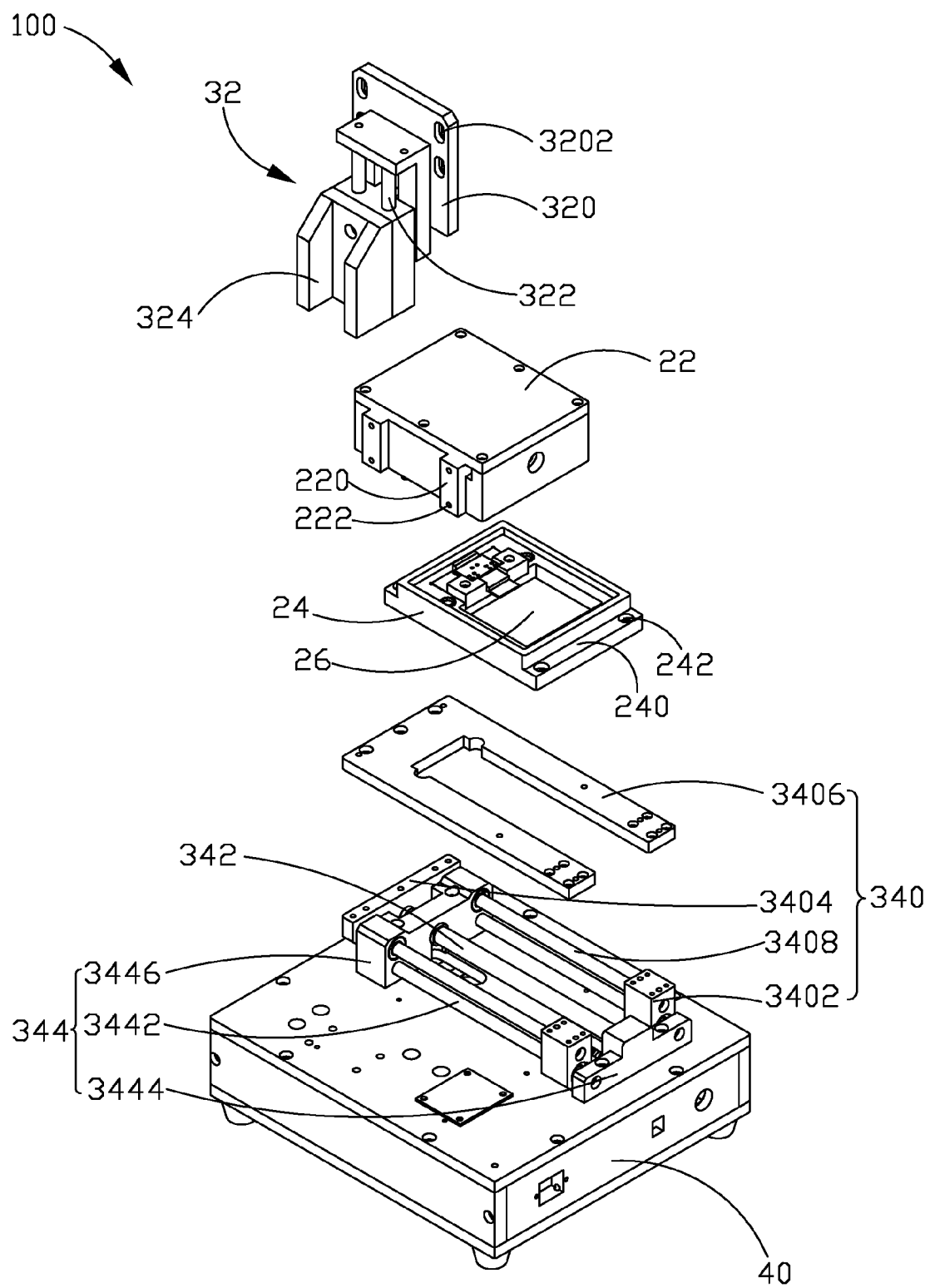
FIG. 2 is similar to FIG. 1, viewed from another aspect.
Figure 4:
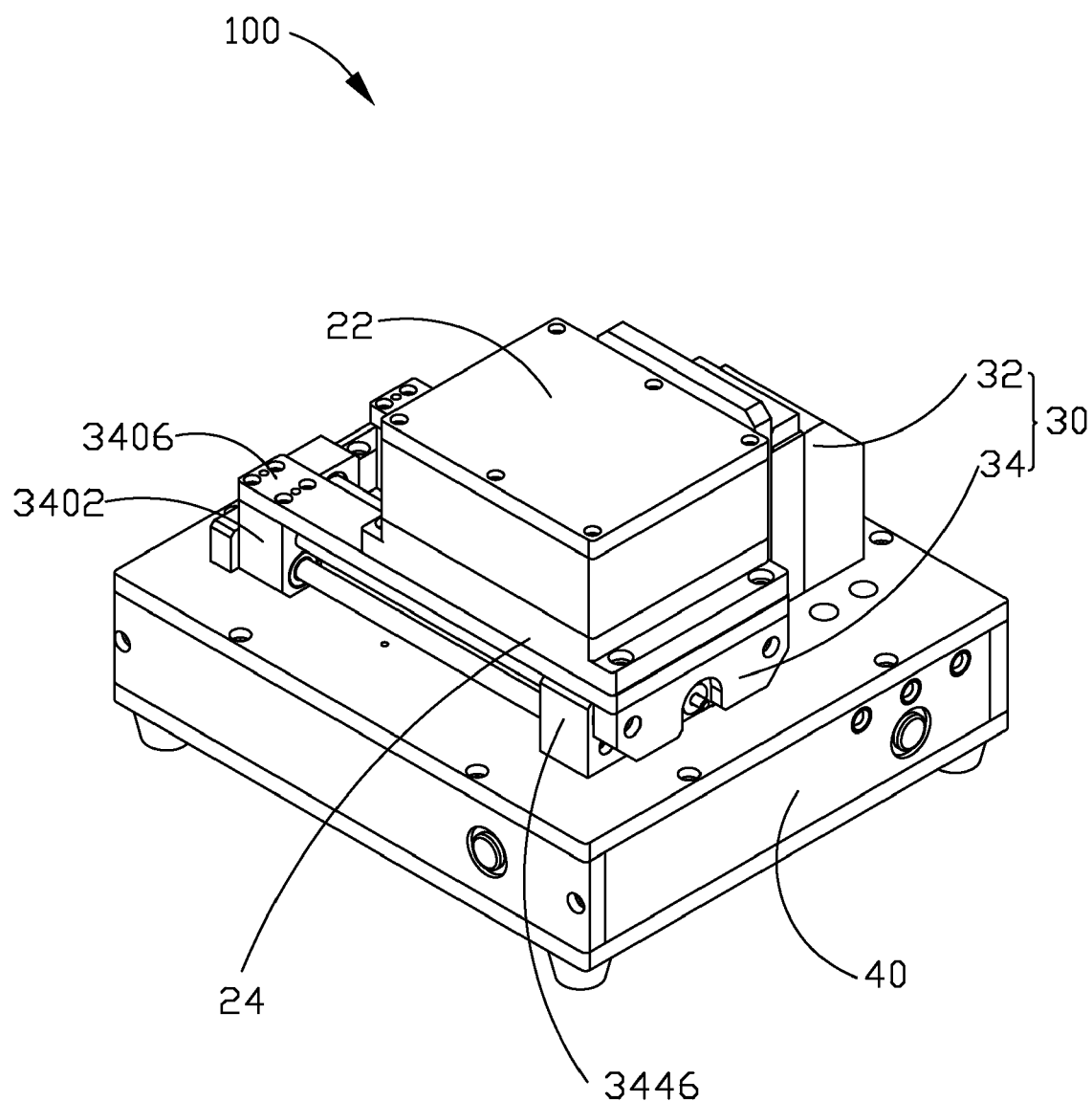
FIG. 4 is similar to FIG. 3, showing the testing device in a second position.

Referring to FIGS. 1-2 and FIG. 4, a testing device 100 is configured for preventing ambient electromagnetic waves from interfering with testing of an electronic device (not shown), such as a printed circuit board (PCB), a battery, or a mobile phone, for example. The testing device 100 includes a shielding case 20, a driving member 30, and a chassis 40.

The shielding case 20 shields the electronic device from electromagnetic interference (EMI). While shielding case 20 here is substantially square, it should be understood that other configurations may be utilized with equal efficacy. The shielding case 20 includes a cover 22, a base 24, and a receiving space 26 for receiving the electronic device. Although a two-part portion of the shielding case 20 is shown for purposes of illustration, it should be understood that the cover 22 and the base 24 can also be formed from one or more individual panels assembled together to form the shielding case 20.

In the illustrated embodiment, the receiving space 26 is defined in an interior of the base 24. Alternatively, the receiving space 26 may be defined within the cover 22 or outside of an area surrounded by the cover 22 and the base 24.

In the illustrated embodiment, the cover 22 is mechanically connected to the base 24. Both cover 22 and the base 24 include electromagnetic wave absorbing materials (not shown) to minimize electromagnetic wave reflection inside the shielding case 20 during testing.

The cover 22 can move vertically relative to the base 24. The cover 22 includes a pair of projections 220 spaced from each other. Each of the projections 220 projects from a sidewall of the cover 22 and defines a pair of mounting holes 222 to attach the cover 22 to the driving member 30.

The base 24 can move horizontally relative to the cover 22. The base 24 includes a pair of flanges 240 extending from two opposite sidewalls thereof. Each of the flanges 240 defines a through hole 242.

The driving member 30 opens and closes the shielding case 20. The driving member 30 is mounted on the chassis 40 and includes a first driving member 32 that moves the cover 22 of the shielding case 20 vertically relative to the chassis 40, and a second driving member 34 that moves the base 22 of the shielding case 20 horizontally relative to the chassis 40.

The first driving member 32 includes a first sliding portion 320 mechanically connected to the cover 22, a first fixing portion 324 mechanically connected to the chassis 40, and a first cylinder 322 mechanically connecting the first sliding portion 320 and the first fixing portion 324. The first cylinder 322 moves the first sliding portion 320 and the cover 22 vertically relative to the chassis 40. The first sliding portion 320 defines two pair of through holes 3202 corresponding to the mounting holes 222 of the cover 22. A plurality of fasteners (not shown) are received in corresponding mounting holes 222 through the through holes 3202, mechanically connecting the first sliding portion 320 to an outside of the cover 22, whereby the first driving member 32 is mechanically connected to the outside of the cover 22.

The second driving member 34 includes a second sliding member 340 mechanically connected to the base 24, a second fixing portion 344 mechanically connected to the chassis 40, and a second cylinder 342 mechanically connecting the second fixing portion 344 and the second sliding member 340. The second cylinder 342 moves the second sliding member 340 and the base 24 horizontally relative to the chassis 40.

The second fixing portion 344 includes a pair of rails 3442, a limiting block 3444, and a fixing block 3446. The pair of rails 3442 mechanically connect the limiting block 3444 and the fixing block 3446. The limiting block 3444 and the fixing block 3446 are fixed on the chassis 40, and limit displacement of the second sliding member 340.

The second sliding member 340 includes a pair of sliding blocks 3402 positioned between the limiting block 3444 and the fixing block 3446, a sliding portion 3404 adjacent to the fixing block 3446, a supporting plate 3406 mechanically connected to the pair of sliding blocks 3402 and the sliding portion 3404, and a pair of connecting poles 3408 each extending through the fixing block 3446 to connect the pair of sliding blocks 3402 and the sliding portion 3404. The supporting plate 3406 is mechanically connected to the flange 240 of the base 24, mechanically connecting the second driving member 34 to the flange 240 of the base 24. The second cylinder 342 extends through the fixing block 3446 to mechanically connect the limiting block 3444 and the sliding portion 3404. The second cylinder 342 moves the pair of the sliding blocks 3402 horizontally along the pair of rails 3442, resulting in the base 24 of the shielding case 20 moving horizontally.

In assembly, the first driving member 32 and the second driving member 34 of the driving member 30 are attached to the chassis 40. The cover 22 of the shielding case 20 is attached to the first sliding portion 320 of the first driving member 32. The base 24 of the shielding case 20 is attached to the second sliding member 340 of the second driving member 34. Thus, the driving member 30, the shielding case 20, and the chassis 40 are assembled in the testing device 100.

Figure 3:
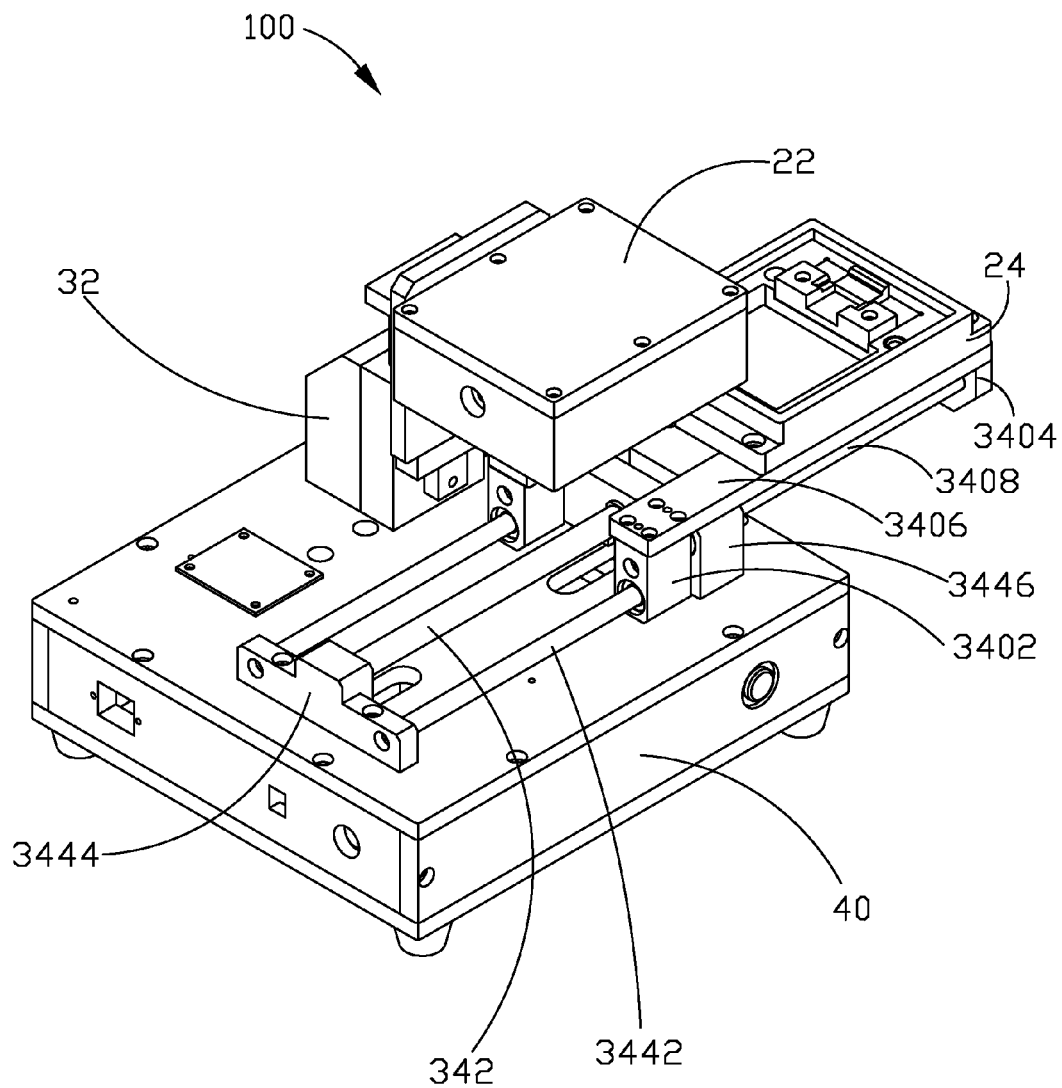
FIG. 3 is an assembled view of FIG. 1, showing the testing device in a first position.

FIG. 3 is an assembled view of the testing device 100 in a first position. FIG. 4 is an assembled view of the testing device 100 in a second position. In use, the first driving member 32 moves the cover 22 vertically upward and the second driving member 34 moves the base 24 horizontally along a first direction, resulting in the testing device 100 being in the first position and the shielding case 20 being in an open position. In the first position, the electronic device can be placed in or removed from the shielding case 20. The first driving member 32 moves the cover 22 downward and the second driving member 34 moves the base 24 horizontally in a second direction opposite to the first direction, with the driving device 100 finishing in the second position and the shielding case 20 ready to be in a closed position. In the second position, various functions of the electronic device can be tested.

Because the first sliding portion 320 of the first driving member 32 is mechanically connected to the outside of the cover 22 of the shielding case 20, and the second sliding member 340 of the second driving member 34 is mechanically connected to the outside of the base 24 of the shielding case 20, the shielding case 20 is in the closed position during the testing of the electronic device. In other words, because the shielding case 20 is closed during the testing of the electronic device, ambient electromagnetic waves cannot enter the shielding case 20, and electromagnetic waves generated by the electronic device do not escape from the shielding case 20. Accordingly, the testing device 100 protects the electronic device from EMI during testing, and failed testing of the electronic device is avoided.

While an embodiment of the present disclosure has been described, it should be understood that it has been presented by way of example only and not by way of limitation. Thus the breadth and scope of the present disclosure should not be limited by the above-described exemplary embodiments, but should be defined only in accordance with the following claims and their equivalents.

What is claimed is:

1. A testing device for testing electronic devices, the testing device comprising:
   a shielding case contoured to define a receiving space for receiving the electronic devices therein, wherein said shielding case comprises a cover, and a base movable relative to the cover; and
   a driving member that opens and closes the shielding case, the driving member comprising a first driving member mechanically connected to an outside of the cover of the shielding case and a second driving member mechanically connected to an outside of the base of the shielding case, wherein the first driving member moves the cover vertically relative to the base, and the second driving member moves the base horizontally relative to the cover;
   wherein movement of the shielding case in an open position allows the electronic device to be received in or removed from the shielding case, and wherein movement of the shielding case in a closed position allows the electronic device to be tested and shielded from electromagnetic interference.

2. The testing device as recited in claim 1, wherein the first driving member comprises a first sliding portion mechanically connected to the outside of the cover, a first fixing portion mechanically connected to a chassis, and a first cylinder mechanically connecting the first sliding portion and the first fixing portion, wherein the first cylinder moves the cover and the first sliding portion vertically relative to the chassis.

3. The testing device as recited in claim 2, wherein the second driving member comprises a second sliding member mechanically connected to the outside of the base, a second fixing portion mechanically connected to the chassis, and a second cylinder mechanically connecting the second fixing portion and the second sliding member, wherein the second cylinder moves the base and the second sliding member horizontally relative to the chassis.

4. The testing device as recited in claim 3, wherein the second fixing portion comprises a fixing block fixed on the chassis, a limiting block fixed on the chassis, and a pair of rails mechanically connecting the limiting block and the fixing block.

5. The testing device as recited in claim 4, wherein the limiting block and the fixing block limit displacement of the second sliding member.

6. The testing device as recited in claim 4, wherein the second sliding member comprises a pair of sliding blocks positioned between the limiting block and the fixing block, a sliding portion adjacent to the fixing block, a supporting plate mechanically connected to the pair of sliding blocks and the sliding portion, and a pair of connecting poles each extending through the fixing block to connect the pair of sliding blocks and the sliding portion.

7. The testing device as recited in claim 6, wherein the second cylinder extends through the fixing block to mechanically connect the limiting block and the sliding portion, and moves the pair of sliding blocks horizontally along the pair of rails.

8. A testing device comprising:
   a chassis;
   a shielding case comprising a moveable cover, and a moveable base; and
   a driving member mounted on the chassis, the driving member comprising a first driving member comprising a first sliding portion mechanically connected to an outside of the cover of the shielding case, a first fixing portion mechanically connected to the chassis, and a first cylinder mechanically connecting the first sliding portion and the first fixing portion, wherein the first cylinder moves the cover and the first sliding portion vertically relative to the chassis; and
   a second driving member comprising a second sliding member mechanically connected to an outside of the base of the shielding case, a second fixing portion mechanically connected to the chassis, and a second cylinder mechanically connecting the second fixing portion and the second sliding member, wherein the second cylinder moves the base and the second sliding member horizontally relative to the chassis.

9. The testing device as recited in claim 8, wherein the second fixing portion comprises a fixing block fixed on the chassis, a limiting block fixed on the chassis, and a pair of rails mechanically connecting the limiting block and the fixing block.

10. The testing device as recited in claim 9, wherein the limiting block and the fixing block limit displacement of the second sliding member.

11. The testing device as recited in claim 9, wherein the second sliding member comprises a pair of sliding blocks positioned between the limiting block and the fixing block, a sliding portion adjacent to the fixing block, a supporting plate mechanically connected to the pair of sliding blocks and the sliding portion, and a pair of connecting poles each extending through the fixing block to connect the pair of sliding blocks and the sliding portion.

12. The testing device as recited in claim 11, wherein the second cylinder extends through the fixing block to mechanically connect the limiting block and the sliding portion, and moves the pair of the sliding blocks horizontally along the pair of rails.

* * * * *